(12) United States Patent
Li et al.

(10) Patent No.: US 6,294,810 B1
(45) Date of Patent: *Sep. 25, 2001

(54) EEPROM CELL WITH TUNNELING AT SEPARATE EDGE AND CHANNEL REGIONS

(75) Inventors: Xiao-Yu Li, Santa Jose; Steven J. Fong, Santa Clara, both of CA (US)

(73) Assignee: Vantis Corporation, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/218,987

(22) Filed: Dec. 22, 1998

(51) Int. Cl.[7] .......................... H01L 29/792; G11C 16/04
(52) U.S. Cl. ........................ 257/321; 257/314; 257/315; 257/318; 257/326; 365/185.01; 365/185.05; 365/185.26; 365/185.28
(58) Field of Search ..................................... 257/314–315, 257/321, 318, 326; 365/185.26, 185.01, 185.05, 185.28

(56) References Cited

U.S. PATENT DOCUMENTS

| | | |
|---|---|---|
| 4,037,242 | 7/1977 | Gosney . |
| 4,715,014 | 12/1987 | Tuvell et al. . |
| 4,924,278 | 5/1990 | Logie ................................... 357/23.5 |
| 5,440,159 | 8/1995 | Larsen et al. . |
| 5,457,652 | 10/1995 | Brahmbhatt . |
| 5,487,033 | 1/1996 | Keeney et al. . |
| 5,491,657 | 2/1996 | Haddad et al. . |
| 5,504,706 | 4/1996 | D'Arrigo et al. . |
| 5,587,945 | 12/1996 | Lin et al. . |
| 5,596,524 | 1/1997 | Lin et al. . |
| 5,615,150 | 3/1997 | Lin et al. . |
| 5,615,152 | 3/1997 | Bergemont . |
| 5,640,346 | 6/1997 | Preslar . |
| 5,646,901 | 7/1997 | Sharpe-Geisler et al. . |
| 5,742,542 | 4/1998 | Lin et al. . |
| 5,761,116 | 6/1998 | Li et al. . |
| 5,872,732 | 2/1999 | Wong . |
| 5,886,378 | 3/1999 | Wang . |
| 5,942,780 | 8/1999 | Barsan et al. . |
| 5,969,992 | * 10/1999 | Mehta et al. ..................... 365/185.28 |
| 5,999,449 | 12/1999 | Mehta et al. . |

FOREIGN PATENT DOCUMENTS

| | | |
|---|---|---|
| 0 295 935 | 12/1988 | (EP) . |
| 0 493 640 | 7/1992 | (EP) . |
| 0 776 049 | 5/1997 | (EP) . |
| 10223782 | 8/1998 | (JP) . |
| 96 21273 | 7/1996 | (WO) . |
| 98 19343 | 5/1998 | (WO) . |

* cited by examiner

Primary Examiner—Tom Thomas
Assistant Examiner—Donghee Kang
(74) Attorney, Agent, or Firm—Fliesler Dubb Meyer & Lovejoy LLP

(57) ABSTRACT

An EEPROM cell is described that is programmed and erased by electron tunneling at separate regions, an edge of a tunneling drain and a sense transistor channel. The EEPROM cell has three transistors formed in a semiconductor substrate. The three transistors are a tunneling transistor (NMOS), a sense transistor (NMOS) and a read transistor (NMOS). Electron tunneling occurs to program the EEPROM cell through a sense tunnel oxide layer by electron tunneling across an entire portion of a sense channel upon incurrence of a sufficient voltage potential between a floating gate and the sense channel. Electron tunneling also occurs to erase the EEPROM cell through a tunnel oxide layer be electron tunneling at an edge of a tunneling drain upon incurrence of a sufficient voltage potential between the floating gate and the tunneling drain.

19 Claims, 2 Drawing Sheets

EEPROM CELL WITH TUNNELING AT SEPARATE EDGE AND CHANNEL REGIONS

BACKGROUND OF THE INVENTION

1. Field of the Invention

This invention relates generally to semiconductor devices, and more particularly, to an electrically erasable programmable read only memory ("EEPROM") cell.

2. Description of Related Art

The semiconductor community faces increasingly difficult challenges as it moves into production of semiconductor devices at feature sizes approaching 0.1 micron. Cell designs for typical semiconductor devices must be made more reliable, scalable, cost effective to manufacture and able to operate at lower power in order for manufacturers to compete in the semiconductor industry. EEPROM devices are one of such semiconductor devices that must meet these challenges.

EEPROM devices are generally known as read-only memory in which the memory cells that store information may be erased and reprogrammed electrically. An EEPROM cell is typically made up of three separate transistors, namely, a write transistor, a sense transistor and a read transistor. The EEPROM cell is able to be programmed, erased and read by removing or adding electrons to a floating gate. Thus, in one example, the floating gate is programmed by removing free electrons from the floating gate and thereby giving the floating gate a positive charge. When it is desired to erase the EEPROM cell in this example, the floating gate is given a net negative charge by injecting electrons onto the floating gate. The read operation is performed by reading the state (current) of the sense transistor. In order to give the floating gate a positive charge (program) or negative charge (erase), electron tunneling, for example using the well-known Fowler-Nordheim tunneling technique, may be performed by applying the appropriate voltage potentials between the floating gate and a region, such as a drain region, of a transistor. Upon applying the appropriate voltage potentials, electron tunneling occurs through a tunnel oxide layer between the floating gate and the region.

As the feature sizes of EEPROM cells are scaled downward, the prior art EEPROM cells exhibit certain scaleablity, cost and reliability limitations. First, the manufacturing process for a smaller EEPROM cell becomes more complex and, accordingly, manufacturing costs rise as transistor channel lengths are reduced. For example, as the channel length of a transistor of the EEPROM cell is scaled downward, the thickness of the gate oxide overlying the channel must also be reduced since the gate oxide thickness must be scaled with the channel length. In view of the fact that EEPROM cells already have a complex process to form multiple oxide thicknesses, additional oxide thicknesses for the transistors would add additional steps to further complicate the manufacturing process and thereby increase manufacturing costs.

In addition to this scaling problem, reliability problems also exist with previous EEPROM cells. First, the EEPROM cell is typically both programmed and erased through one tunnel oxide window of a transistor region that may deteriorate the cell quickly. In general, the tunnel oxide window deteriorates after tens of thousands of program/erase cycles and that deterioration cycle is shortened by only using the tunnel oxide window for both programming and erasing operations. Thus, the use of the window for both programming and erasing of the EEPROM cell causes the cell to be significantly less reliable. A further reliability limitation of previous EEPROM cells is that the tunnel oxide window is less reliable because it is formed over a highly doped program junction (PRJ). The high doping concentration of the PRJ degrades the surface immediately above the PRJ and thereby reduces the EEPROM cell's reliability. A still further limitation of the EEPROM cell is that the voltages needed to program, erase and read the cell are high due to the relatively large feature sizes of the cell. Thus, in order to achieve lower voltages to operate the EEPROM cell, feature sizes of the cell must be scaled downward.

Thus, a need exists for a redesigned EEPROM cell that (1) does not add costly steps to the manufacturing process, (2) does not suffer from reliability problems caused by both programing and erasing through one tunnel oxide window, (3) does not deteriorate through use of a PRJ oxide, and (4) operates at a lower power by using smaller feature sizes.

SUMMARY OF THE INVENTION

An EEPROM cell is described that is programmed and erased by electron tunneling at separate transistor regions, namely at an edge of a tunneling transistor drain and a sense transistor channel. The EEPROM cell has three transistors formed in a semiconductor substrate: a tunneling transistor, a sense transistor and a read transistor. The tunneling transistor has a tunneling source, a tunneling drain, and a tunneling channel between the tunneling source and the tunneling drain. The tunneling source and the tunneling drain have a second conductivity type that is opposite a first conductivity type of the semiconductor substrate. A tunnel oxide layer is formed over the tunneling channel, the tunneling source and the tunneling drain. Between the tunneling transistor and the sense transistor is a program junction region, also formed in the semiconductor substrate, and separated from the tunneling transistor by a first oxide and separated from the sense transistor by a second oxide. The program junction region, having the second conductivity type, also has a program junction oxide layer overlying the program junction region. The sense transistor is also formed in the semiconductor substrate. The sense transistor has a sense source, a sense drain and a sense channel between the sense source and the sense drain where both the sense source and the sense drain have the second conductivity type. A sense tunnel oxide layer overlies the sense channel, the sense source and the sense drain. The read transistor, also formed in the semiconductor substrate, is electrically coupled to the sense transistor through the sense drain. A floating gate overlies the tunnel oxide layer, the program junction oxide layer and the sense tunnel oxide layer. Electron tunneling occurs through the tunnel oxide layer overlying an edge of the tunneling drain upon incurrence of a sufficient voltage potential between the floating gate and the tunneling drain. Electron tunneling also occurs through the sense tunnel oxide layer overlying the sense channel upon incurrence of a sufficient voltage potential between the floating gate and the sense channel.

The EEPROM cell of the present invention provides electron tunneling through the sense tunnel oxide layer overlying the sense channel to occur across the entire portion of the sense channel. The EEPROM cell of the present invention further allows erasing only at the edge of the tunneling drain and programming only across the sense channel to thereby separate the program and erase operations and thereby increase the EEPROM cell reliability. The EEPROM cell further has reduced thicknesses for the tunnel oxide layer, the program junction oxide layer, the sense tunnel oxide layer and the read gate oxide layer to improve scaleablity and reduce operating voltages of the EEPROM cell of the present invention.

BRIEF DESCRIPTION OF THE DRAWINGS

A better understanding of the present invention can be obtained when the following detailed description of a preferred embodiment is considered in conjunction with the following drawings, in which.

Figure 1:
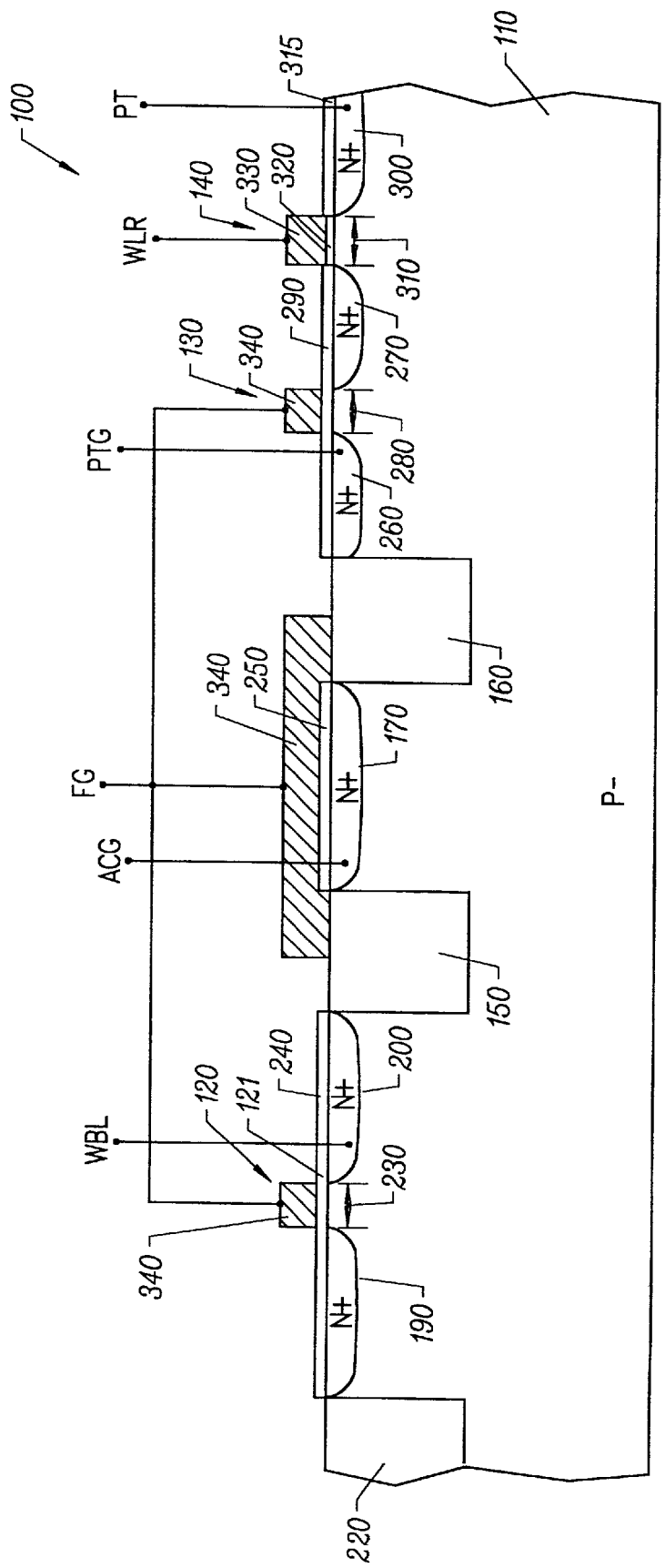
FIG. 1 is a cross-sectional view of an embodiment of the EEPROM cell of the present invention.

It will be appreciated that for simplicity and clarity of illustration, elements illustrated in the drawings have not necessarily been drawn to scale. For example, the dimensions of some of the elements are exaggerated relative to other elements for purposes of clarity. Further, where considered appropriate, reference numerals have been repeated among the drawings to represent corresponding or analogous elements.

DETAILED DESCRIPTION

Alternative embodiments of the EEPROM cell of the present invention are described below, along with the general process for manufacturing those embodiments. The operation of those embodiments is then provided in Table 1 and described in detail to explain the programming, erasing and reading functions of the embodiment of the EEPROM cell of the present invention.

FIG. 1 is a cross-sectional view of an embodiment of the EEPROM cell of the present invention. In FIG. 1, the embodiment of the EEPROM cell 100 is formed on a semiconductor substrate 110, for example a silicon substrate, and has a first conductivity type such as a P-type conductivity. In alternative embodiments, the semiconductor substrate 110 may be alternative silicon materials well-known in the semiconductor industry such as germanium, germanium/silicon, gallium arsenide, polysilicon, silicon on insulator or the like. The EEPROM cell 100 has three separate transistors formed in the semiconductor substrate 110, namely, a tunneling transistor 120, a sense transistor 130 and a read transistor 140. A program junction region 170 is also formed in the semiconductor substrate 110 and is electrically separated from the tunneling transistor 120 by a first oxide 150, e.g. silicon dioxide, also formed in the semiconductor substrate 110. The program junction region 170 has a second conductivity type that is opposite the first conductivity type, such as an N+ conductivity type. A second oxide 160 is used to separate the sense transistor 130 from the program junction region 170. The second oxide 160, like the first oxide 150, is composed of an insulating material, such as silicon dioxide. Returning to the tunneling transistor 120, the tunneling transistor 120 has a tunneling source 190 and a tunneling drain 200. The tunneling source 190 and tunneling drain 200 have the second conductivity type, e.g. a N+ type conductivity. The tunneling transistor 120 is therefore an NMOS transistor in this embodiment. A tunneling channel 230 is formed between the tunneling source 190 and tunneling drain 200. Overlying the tunneling source 190, the tunneling channel 230 and the tunneling drain 200 is a tunnel oxide layer 240. The tunnel oxide layer 240 is typically composed of an insulating material, such as silicon dioxide, and has a thickness in the range of 70–90 angstroms, and, in one embodiment, is approximately 80 angstroms. It is noted that such a thickness for the tunnel oxide layer 240 is considerably less than the approximate 150 angstroms or greater used in prior art devices and therefore the EEPROM cell is smaller and requires less power to operate. An edge 121 of the tunneling drain 200 is used to perform electron tunneling to operate the EEPROM cell as described below. Overlying the program junction region 170 is a program junction oxide layer 250 that is composed of an insulating material, such as silicon dioxide. The program junction oxide layer 250 has a thickness of approximately 96 angstroms, which is also an improvement over prior art devices that had thicknesses greater than 180 angstroms. It is noted that while the thickness of the tunnel oxide layer 240 is approximately 80 angstroms and the thickness of the program junction oxide layer is approximately 96 angstroms, both layers may be deposited or grown (using conventional oxide deposition techniques) in a single process step. This is because the program junction oxide layer 250 is grown on a highly doped N+ program junction region 170 that characteristically, as is well known to one skilled in the art, "expands" the thickness of the program junction oxide layer 250 to 96 angstroms, while the tunnel oxide layer 240, overlying the N+ type tunneling source 190 and the N+ type tunneling drain 200, remains at 80 angstroms. Thus, additional process steps, to form oxide layers with different thicknesses, are avoided.

Returning to FIG. 1, the sense transistor 130 has a sense source 260 and a sense drain 270 formed in the semiconductor substrate 110. A sense channel 280 is formed between the sense source 260 and the sense drain 270. The conductivity of the sense source 260 and the sense drain 270 is of the second conductivity type, for example, an N+ conductivity type. Overlying the sense source 260, the sense drain 270 and the sense channel is a sense tunnel oxide layer 290 having an approximate thickness in the range of approximately 70–90 angstroms, and in one embodiment, is approximately 80 angstroms. As earlier described, the sense tunnel oxide layer 290 may also be simultaneously formed with the tunnel oxide layer 240 and the program junction oxide layer 250. Depending on the mode of sense transistor 140 (depletion or enhancement mode), the relevant voltages for operating the EEPROM cell 100 are adjusted. The sense transistor 130 is, in one embodiment, a depletion mode transistor, as is commonly understood in the industry. In a further embodiment, the sense transistor 130 is an enhancement mode transistor (also as is commonly known in the industry).

The read transistor 140 shares the sense drain 270 with the sense transistor 130 which acts as the read source 270. The read transistor 140 also has a read drain 300 that has the second conductivity type, e.g. an N+ conductivity type. Overlying the read drain 300 is a read drain oxide 315 layer that is composed of an insulating material, such a silicon dioxide, and has an approximate thickness in the range of approximately 70–90 angstroms, and in one embodiment, is approximately 80 angstroms. The read drain oxide layer 315 is formed in the same step as the tunnel oxide layer 240, the program junction oxide layer 250 and the sense tunnel oxide layer 290. Between the read source 270 and the read drain 300 is a read channel 310. Overlying the read channel 310 is a read gate oxide layer 320 that has a thickness of approximately 35 angstroms and is composed of an insulating material, such as silicon dioxide. The formation of the read gate oxide layer 320 requires additional separate process steps, as described below, then the oxide layers 240, 250, 290 and 315. This is because the thickness of the read gate oxide layer 320 is considerably less than the other layers. A read gate 330 overlies the read gate oxide layer 320 and is composed of a conducting material, such as a polycrystalline silicon material. A floating gate 340 overlies the tunnel oxide layer 240 overlying the tunneling channel 230 of the tunneling transistor 120, the program junction oxide layer 250 and the sense tunnel oxide layer 290 overlying the sense channel 280 of the sense transistor 130. The floating gate 340 is also formed of a conducting material, such as a polycrystalline silicon material.

The transistors 120, 130, 140 of the EEPROM cell 100 are electrically coupled to certain electrical lines and gates in order to operate and control the functions of the EEPROM cell 100. As shown in FIG. 1, Word Bit Line (WBL) is electrically coupled to the tunneling drain 200. The WBL is electrically coupled to the tunneling drain 200 to erase the EEPROM cell 100 as described below. An Array Control Gate (ACG) is electrically coupled to the program junction region 170 while a Product Term Ground (PTG) is electrically coupled to the sense source 260 of the sense transistor 130. A Word Line Read (WLR) is electrically coupled to the read gate 330 of the read transistor 140 and a Product Term (PT) is electrically coupled to the read drain 300. It is understood that electrical coupling includes any manner of transmitting charge between the two items being coupled.

The method of manufacturing the EEPROM cell 100 of FIG. 1 includes standard deposition and etching techniques for forming the EEPROM cell 100 shown in FIG. 1. For example, in one embodiment, the EEPROM cell 100 is formed as follows. The semiconductor substrate 110, which may have an epitaxial layer (not shown) on the top surface of the semiconductor substrate 110, is patterned and etched (using conventional techniques) to form deep trenches in the semiconductor substrate 110 for the oxide regions 220, 150, and 160 of FIG. 1. The semiconductor substrate may be a P type substrate or a P type epitaxial layer may also be used on an N type substrate. The program junction 170 is then formed by implanting the highly doped N+ conductivity type into the semiconductor substrate 110. The tunnel oxide layer 240, the program junction oxide layer 250, the sense tunnel oxide layer 290 and the read oxide layer 315 are then formed using common deposition or oxide growing techniques. In one embodiment, these layers are formed as follows. An oxide layer is grown across the entire semiconductor substrate having an approximate thickness of about 50 to 60 angstroms. Using conventional patterning techniques, the oxide layer is masked except for the area overlying the read channel 310. Etching is then performed to remove the oxide layer overlying the read channel 310. A second oxide layer having a thickness of approximately 35 angstroms is then formed over the oxide layer and the semiconductor surface overlying the read channel 310. At this point, a 35 angstrom oxide layer (read gate oxide layer 320) has been formed. Also, the other oxide layers (tunnel oxide layer 240, program junction oxide layer 250, sense tunnel oxide layer 290) have also been formed, each having a combined thickness of approximately 80 angstroms (approximately 50 angstrom oxide layer and 35 angstrom second oxide layer). The thickness of these oxides is therefore approximately 80 angstroms, except for the program junction oxide layer 250 that is approximately 96 angstroms. All the gates of the tunneling transistor 120, sense transistor 130 and read transistor 140, including floating gate 340, are then formed using conventional techniques. These gates are typically composed of a conducting material, for example, a polysilicon material. Next, the source and drain implants are formed for each transistor 120, 130, 140, and standard back end (as is commonly known to those skilled in the art) is performed. It is understood that a plurality of EEPROM cells may be manufactured into an EEPROM device in order to store a multitude of information. The EEPROM cell further includes numerous metallization layers (not shown) overlying the cell 100 to electrically connect the cell 100 to other cells and other devices in an EEPROM device, as well as passivation layers (not shown) to protect the cell 100.

The three operations of the EEPROM cell 100 are program, erase and read. The various voltages applied to the EEPROM cell to perform these operations are shown in Table 1 below.

TABLE 1

|  | WBL | ACG | PTG | WLR | PT |
|---|---|---|---|---|---|
| Program | HiZ | $V_{pp}$ | ground | $V_{cc}$ | ground |
| Erase | $V_{pp}$ | ground | ground or HiZ | ground | HiZ |
| Read (Depeletion Mode) | HiZ | ground | ground | $V_{cc}$ | $V_{cc}/2$ ($V_t$) |
| Read (Enhancement Mode) | HiZ | $V_{cc}$ | ground | $V_{cc}$ | $V_{cc}/2$ ($V_t$) |

The program operation of the EEPROM cell 100 of FIG. 1 is defined, for this embodiment, as providing a net negative charge on the floating gate 340. For the erase operation, a positive charge is provided on the floating gate 340. It is understood, however, that alternative embodiments may deviate from this definition, yet fall within the scope of the present invention as claimed below. That is, the erase operation may put a negative charge on the floating gate 340 as long as the program operation puts the opposite charge (positive) on the erase operation. Thus, alternative embodiments may create potentials between the floating gate 340 and the appropriate regions that provide a net negative charge on the floating gate 340 to erase the EEPROM cell 100 of FIG. 1 and provide a positive charge on the floating gate 340 to program the EEPROM cell 100. Again, the erase operation is merely the consistent opposite of the program operation. In a further embodiment, the difference in charge level may differentiate between a program and erase operation. Thus, by increasing a charge to a sufficient level, the operation may change from a program operation to an erase operation, or vice versa.

In order to program the EEPROM cell 100 of FIG. 1, in one embodiment, the floating gate 340 is given a negative charge by moving electrons to the floating gate 340. The method of moving electrons to the floating gate 340 is commonly known to those skilled in the art as Fowler-Nordheim tunneling. In general, this process has electrons tunnel through a barrier, for example a thin oxide layer, in the presence of a high electric field. However, unlike previous EEPROM cells that performed the electron tunneling through one oxide window at the edge of a drain region, the present invention provides for electron tunneling at separate regions, namely the sense channel 280 and the edge 121 of the tunneling drain 200. Further, the entire portion of the sense channel 280 is used for electron tunneling. The advantages of such electron tunneling are described below.

In one embodiment, programming of the EEPROM cell 100 of FIG. 1 is performed by moving electrons to the floating gate 340 through the sense tunnel oxide layer 290 and across the entire portion of the sense channel 280. It is understood that the entire portion of the sense channel 280 means the distance between the sense source 260 and the sense drain 270 underlying the sense tunnel oxide layer 290. In order to move the electrons to floating gate 340 to program the EEPROM cell 100, $V_{pp}$ for example 10 volts, is applied to ACG. Since the program junction region 170 is capacitively coupled to the floating gate 340 through the program junction oxide layer 250, approximately 8 volts is placed on the floating gate 340. WBL is placed at a floating voltage of HiZ, that is, WBL is not connected to a voltage or ground and therefore has a varying potential. PTG and PT are grounded while WLR is set to $V_{cc}$, for example 1.8 volts. The floating gate 340 is at a high voltage, the sense source 260 is grounded and the sense drain 270 is grounded due to the channel formation. That is, the read gate 330 is on so the grounded PT grounds the sense drain 270 (read source 270) due to the channel formation (on read transistor 140). At these potentials, as well as having the substrate 110 grounded, a potential is created between the floating gate 340 and the sense channel 280. The sense tunnel oxide layer 290 immediately above the sense channel 280 has a thickness of approximately 80 angstroms, in one embodiment, so that electron tunneling occurs across the entire portion of the sense channel 280 and through the sense tunnel oxide layer 290 since the programming voltages previously mentioned provide a sufficient voltage potential between the floating gate 340 and the sense channel 280. The voltages provided in this embodiment may vary in alternative embodiments as long as a sufficient potential is created to move electrons through the sense tunnel oxide layer 290 onto the floating gate 340 across the sense channel 280. Likewise, the oxide layer thicknesses, of all oxide layers used for electron tunneling, may also vary as long as the thickness is sufficient to permit electron tunneling at the disclosed potentials.

To erase the floating gate 340, in this same embodiment, electrons are removed from the floating gate 340 through the tunnel oxide layer 240 at the edge 121 of the tunnel drain 200 to give the floating gate 340 a positive charge. To erase the EEPROM cell 100, $V_{pp}$, for example 10 volts, is applied to WBL while ACG, PTG, and WLR are all grounded. PT is provided a HiZ voltage. In an alternative embodiment, all the voltages remain the same except that PTG is at HiZ. Since the tunneling drain 200 is at a relatively high voltage (10 volts), while the floating gate 340 is at a low voltage, a potential is created between the floating gate 340 and the tunneling drain 200 so that electrons tunnel from the floating gate 340 to the tunneling drain 200 through the tunnel oxide layer 240 at an edge 121 of the tunneling drain 200. The erasing operation, in this embodiment, is done in bulk (multiple cells are erased at one time), while the programming operation is selective to certain cells. It is noted that, in this embodiment, the electron tunneling occurs from the floating gate 340 to the tunneling drain 200 at the edge 121 of the tunneling drain 200. However, alternative embodiments may also have electron tunneling to occur at the edge of another region, for example, at the tunneling source 190.

The EEPROM cell 100 has numerous advantages over previous EEPROM cells. First, the erase and program operations are separate in the EEPROM cell. One operation (erase) is performed by electron tunneling at the edge 121 of the tunneling drain 200 from the floating gate 340 to the tunneling drain 200. The other operation (program) is performed across the entire portion of the sense channel 280 from the substrate 110 to the floating gate 340. Thus, the EEPROM cell has improved reliability since separate regions are used for electron tunneling during the different operations. Furthermore, by tunneling across the sense channel, the reliability of the EEPROM cell is increased since a larger oxide is used for programing operations. Further, the entire sense channel is used to program the EEPROM cell as opposed to the edge of a source/drain region. Also, by using the entire channel, reliability of the EEPROM device increases since the entire oxide layer is used rather than only an edge of an oxide layer. The EEPROM cell of FIG. 1 further has the advantage of having thinner oxide layers 240, 250, 290, and 310 which decreases the cell size. Prior art devices had oxide layer thicknesses in excess of 150 angstroms while the present oxide layers have angstroms in the range of 35 to 96 angstroms. Additionally, the present EEPROM cell 100 does not perform the electron tunneling through the PRJ and therefore the tunnel oxide quality is not degraded which provides better cell data retention. Furthermore, the scaling of the tunnel oxide regions from 96 to 80 angstroms means that $V_{pp}$ may also be scaled down which provides an EEPROM cell that operates at lower power.

The EEPROM cell 100 of FIG. 1 is read by determining the state of sense transistor 130. In one embodiment, the sense transistor 130 is a depletion mode transistor in which WBL is set to a HiZ, ACG and PTG are grounded, WLR is set to $V_{cc}$, for example 1.8 volts, and PT is set to $V_T (V_{cc}/2)$, for example 0.7 volts. If the sense transistor 130 is an enhancement mode transistor, ACG is set to $V_{cc}$, for example 1.8 volts, while the remaining voltages remain the same. Thus, the state of sense transistor 140 is a logical 1 during erase since a positive charge is on floating gate 340 while a logical 0 is the state of sense transistor 140 during program. The sense transistor 140 reads a logical 1 if current flows from sense source 260 to sense drain 270. If no current flows, a logical 0 results.

Figure 2:
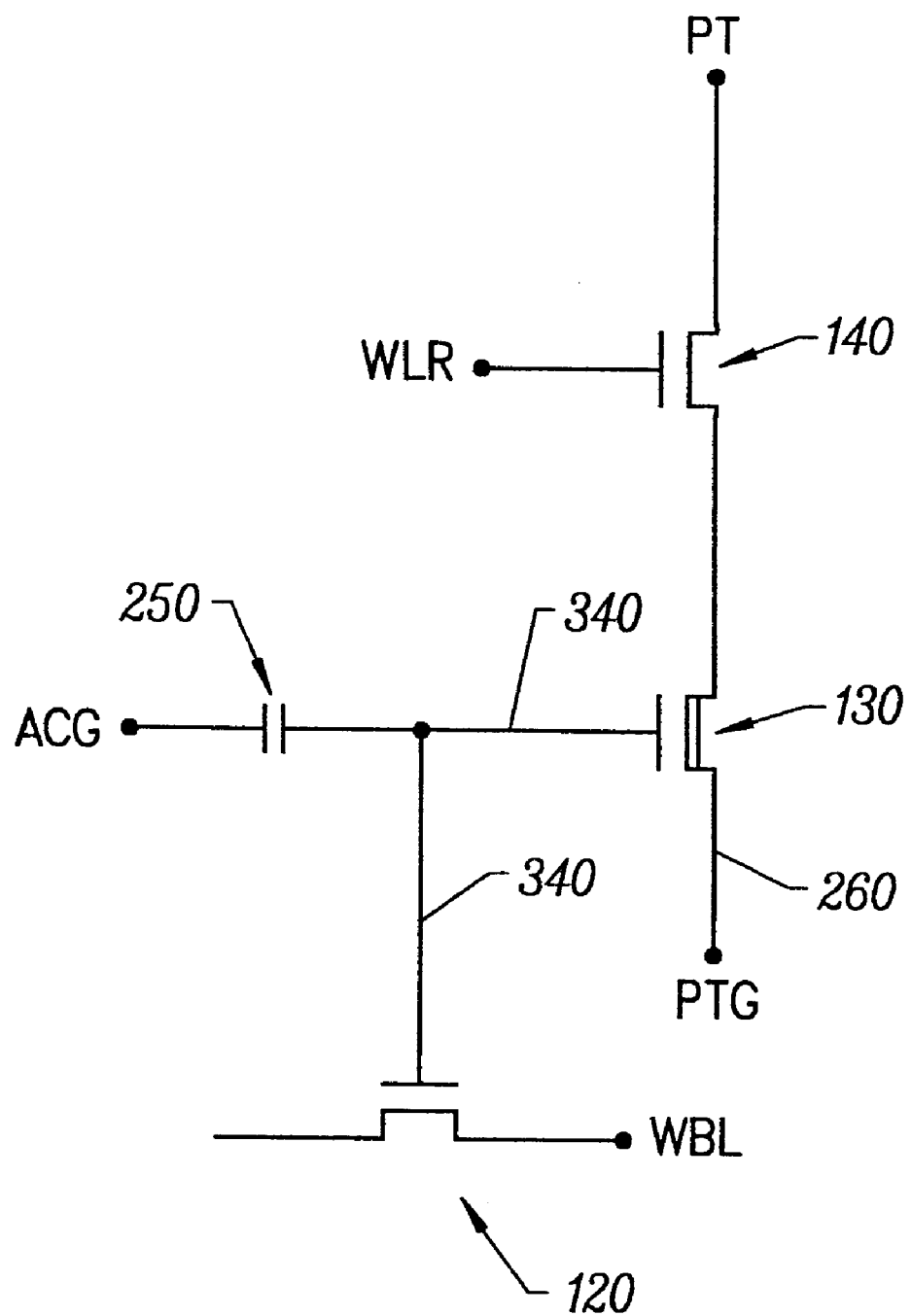
FIG. 2 is a circuit diagram view of an embodiment of the EEPROM cell of the present invention.

FIG. 2 is a circuit diagram view of the embodiment of the EEPROM cell of FIG. 1. In FIG. 2, the three transistors of FIG. 1 including the tunneling transistor 120, the sense transistor 130, and the read transistor 140 are shown. Likewise, the tunneling transistor 120 is shown to be electrically coupled to WBL, while the sense source 260 is electrically coupled to PTG and ACG is capacitively coupled through the tunnel oxide layer 250 to the floating gate 340.

The EEPROM cell of the present invention has been described in connection with the embodiments disclosed herein. Although an embodiment of the present invention has been shown and described in detail, along with variances thereof, many other varied embodiments that incorporate the teachings of the invention may be easily constructed by those skilled in the art that may fall within the scope of the present invention as claimed below.

What is claimed is:

1. An EEPROM cell, comprising:
    a semiconductor substrate, said semiconductor substrate having a first conductivity type;
    a tunneling transistor formed in said semiconductor substrate, said tunneling transistor having a tunneling source, a tunneling drain and a tunneling channel between said tunneling source and said tunneling drain, said tunneling drain and said tunneling source having a second conductivity type that is opposite said first conductivity type;
    a tunnel oxide layer overlying said tunneling channel, said tunneling source and said tunneling drain;
    a program junction region formed in said semiconductor substrate, said program junction region separated from said tunneling transistor by a first oxide, said program junction region having said second conductivity type;
    a program junction oxide layer overlying said program junction region;
    a sense transistor formed in said semiconductor substrate and separated from said program junction region by a second oxide, said sense transistor having a sense source, a sense drain and a sense channel between said sense source and said sense drain, said sense source and said sense drain having said second conductivity type;

a sense tunnel oxide layer overlying said sense channel, said sense source and said sense drain;

a read transistor formed in said semiconductor substrate, said read transistor having a read source and a read drain, said read transistor electrically coupled to said sense transistor through said sense drain; and a floating gate overlying said tunnel oxide layer, said program junction oxide layer and said sense tunnel oxide layer, wherein electron tunneling through said tunnel oxide layer overlying an edge of said tunneling drain occurs upon incurrence of a sufficient voltage potential between said floating gate and said tunneling drain, and wherein electron tunneling through said sense tunnel oxide layer overlying said sense channel occurs upon incurrence of a sufficient voltage potential between said floating gate and said sense channel.

2. The EEPROM cell of claim 1, wherein said first conductivity type is a P type conductivity.

3. The EEPROM cell of claim 2, wherein said second conductivity type is an N type conductivity.

4. The EEPROM cell of claim 1, wherein said electron tunneling through said sense tunnel oxide layer overlying said sense channel occurs across an entire portion of said sense channel.

5. The EEPROM cell of claim 1, wherein said electron tunneling through said tunnel oxide layer overlying said edge of said tunneling drain only erases said EEPROM cell.

6. The EEPROM cell of claim 1, wherein said electron tunneling through said sense tunnel oxide layer only programs said EEPROM cell.

7. The EEPROM cell of claim 1, further comprising:

a word bit line (WBL) electrically coupled to said tunneling drain;

an array control gate (ACG) electrically coupled to said program junction region;

a product term ground (PTG) electrically coupled to said sense source;

a product term (PT) electrically coupled to a read drain of said read transistor; and a word line read (WLR) electrically coupled to said read transistor, wherein said WBL, ACG, PTG, PT and WLR provide said sufficient voltage potential between said floating gate and said tunneling drain and said sufficient voltage potential between said floating gate and said sense channel.

8. The EEPROM cell of claim 7, wherein said sufficient voltage potential between said floating gate and said sense channel is accomplished by providing a floating voltage to said WBL, approximately 10 volts to said ACG, approximately 0 volts to said PTG and said PT, and approximately 1.8 volts to said WLR.

9. The EEPROM cell of claim 7, wherein said sufficient voltage potential between said floating gate and said tunneling drain is accomplished by providing approximately 10 volts to said WBL, approximately 0 volts to said ACG, said PTG and said WLR, and a floating voltage to said PT.

10. The EEPROM cell of claim 7, wherein said sufficient voltage potential between said floating gate and said tunneling drain is accomplished by providing approximately 10 volts to said WBL, approximately 0 volts to said ACG and said WLR, and a floating voltage to said PTG and said PT.

11. The EEPROM cell of claim 7, wherein said sense transistor is a depletion mode transistor.

12. The EEPROM cell of claim 11, wherein a current flows between said sense source and said sense drain when said WBL has a floating voltage, said ACG and said PTG has approximately 0 volts, said WLR has approximately 1.8 volts and said PT has approximately 0.7 volts.

13. The EEPROM cell of claim 7, wherein said sense transistor is an enhancement mode transistor.

14. The EEPROM cell of claim 13, wherein a current flows between said sense source and said sense drain when said WBL has a floating voltage, said ACG and said WLR has approximately 1.8 volts, said PTG has approximately 0 volts and said PT has approximately 0.7 volts.

15. The EEPROM cell of claim 1, wherein said tunnel oxide layer has a thickness of approximately 80 angstroms.

16. The EEPROM cell of claim 1, wherein said second program junction oxide layer has a thickness of approximately 96 angstroms.

17. The EEPROM cell of claim 1, wherein said sense tunnel oxide layer has a thickness of approximately 80 angstroms.

18. An EEPROM cell, comprising:

a semiconductor substrate, said semiconductor substrate having a P conductivity type;

a tunneling transistor formed in said semiconductor substrate, said tunneling transistor having a tunneling source, a tunneling drain and a tunneling channel between said tunneling source and said tunneling drain, said tunneling drain and said tunneling source having an N conductivity type, said tunneling drain being electrically coupled to a word bit line;

a program junction region formed in said semiconductor substrate, said program junction region separated from said tunneling transistor by a first oxide, said program junction region having said N conductivity type, said program junction region being electrically coupled to an array control gate;

a program junction oxide layer overlying said program junction region;

a sense transistor formed in said semiconductor substrate and separated from said program junction region by a second oxide, said sense transistor having a sense source, a sense drain and a sense channel between said sense source and said sense drain, said sense source and said sense drain having said N conductivity type, said sense source being electrically coupled to a product term ground;

a sense tunnel oxide layer overlying said sense channel, said sense source and said sense drain;

a read transistor formed in said semiconductor substrate, said read transistor electrically coupled to said sense transistor through said sense drain, said read transistor having a read source and a read drain, said read source and said read drain having said N conductivity type, said read drain being electrically coupled to a product term;

a read gate oxide layer overlying said read channel; and a floating gate overlying said tunnel oxide layer, said program junction oxide layer and said sense tunnel oxide layer, wherein electron tunneling through said tunnel oxide layer overlying an edge of said tunneling drain occurs upon incurrence of a sufficient voltage potential between said floating gate and said tunneling drain, and wherein electron tunneling through said sense tunnel oxide layer overlying said sense channel occurs upon incurrence of a sufficient voltage potential between said floating gate and said sense channel.

19. The EEPROM cell of claim 18, wherein said read gate oxide layer has a thickness of approximately 35 angstroms.

* * * * *